United States Patent [19]

Sakuma

[11] Patent Number: 4,644,445
[45] Date of Patent: Feb. 17, 1987

[54] RESIN MOUNTING STRUCTURE FOR AN INTEGRATED CIRCUIT

[75] Inventor: Kunio Sakuma, Suwa, Japan

[73] Assignee: Seiko Epson Kabushiki Kaisha, Tokyo, Japan

[21] Appl. No.: 891,084

[22] Filed: Jul. 31, 1986

Related U.S. Application Data

[63] Continuation of Ser. No. 832,498, Feb. 20, 1986, abandoned, which is a continuation of Ser. No. 565,259, Dec. 23, 1983, abandoned.

[30] Foreign Application Priority Data

Dec. 27, 1982 [JP] Japan ................................ 57-228953
Sep. 23, 1983 [JP] Japan ................................ 58-179845

[51] Int. Cl.$^4$ ............................................. H05K 1/18
[52] U.S. Cl. ............................ 361/398; 174/68.5;
361/403; 361/406; 361/411; 368/155; 368/159
[58] Field of Search ............ 361/398, 400, 403, 406, 361/409; 174/68.5; 29/834, 835

[56] References Cited

U.S. PATENT DOCUMENTS

| 4,048,438 | 9/1977 | Zimmerman | 174/68.5 |
| 4,065,850 | 1/1978 | Burr et al. | 174/68.5 X |
| 4,143,456 | 3/1979 | Indue | 357/80 X |
| 4,396,936 | 8/1983 | McIver | 174/52 PE X |
| 4,432,131 | 2/1984 | Sadamasa et al. | 29/588 X |
| 4,435,740 | 3/1984 | Huckabee et al. | 361/398 |
| 4,573,105 | 2/1986 | Beldavs | 361/403 |

FOREIGN PATENT DOCUMENTS

| 2081974 | 2/1982 | United Kingdom | 174/52 PE |
| 2097998 | 10/1982 | United Kingdom | 361/398 |

Primary Examiner—R. R. Kucia
Attorney, Agent, or Firm—Blum Kaplan Friedman Silberman & Beran

[57] ABSTRACT

This invention describes an improved resin mounting structure for use with an integrated circuit. An integrated circuit chip is affixed to a circuit substrate which has a hole. Circuit patterns connect to the contact pads of the integrated circuit chip and are added along the circuit substrate. An epoxy resin material is gated through the hole to surround and enclose the integrated circuit chip. In this invention, circuit patterns which are added beneath the integrated circuit chip are positioned over the hole in the substrate to allow an unimpeded flow of resin material. In addition, conductive spacing pegs are provided at each integrated circuit contact pad to allow for a uniform spacing between the integrated circuit and the circuit substrate and to provide for a more electrically and mechanically secure connection between the IC chip and the circuit substrate. Also, the circuit substrate is formed from a flexible material to absorb the displacement caused by differential thermal expansion.

11 Claims, 14 Drawing Figures

FIG. 1a
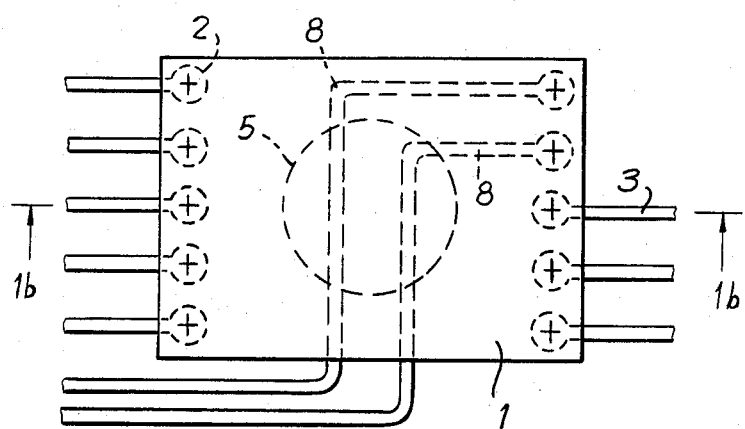
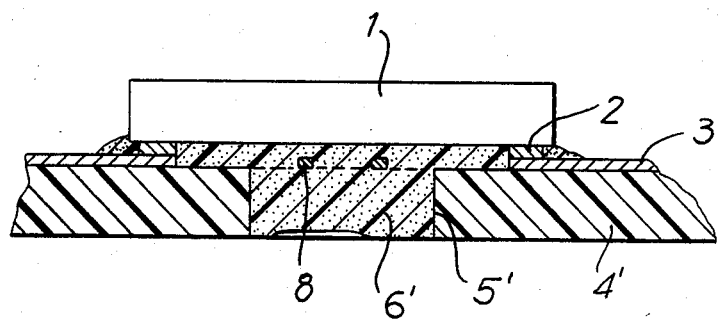
FIG. 1b

FIG. 5
PRIOR ART
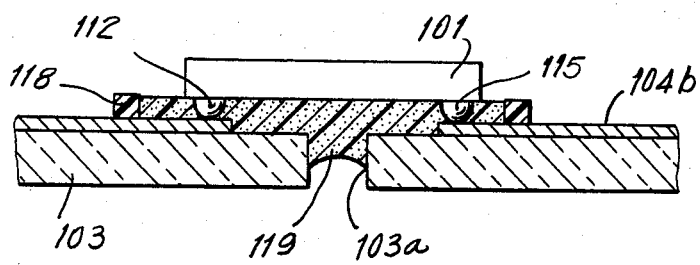
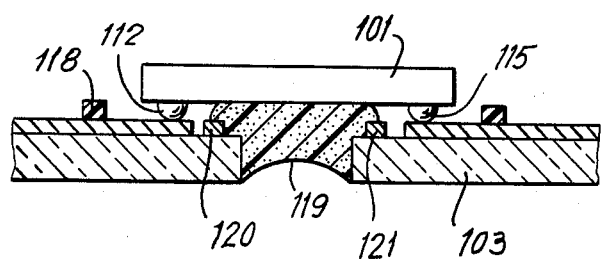
FIG. 7
PRIOR ART

RESIN MOUNTING STRUCTURE FOR AN INTEGRATED CIRCUIT

This is a continuation of application Ser. No. 832,498, filed Feb. 20, 1986, which is a continuation of application Ser. No. 565,259, filed Dec. 23, 1983, now both abandoned.

BACKGROUND OF THE INVENTION

This invention relates generally to an improved circuit mounting structure for use with an integrated circuit chip, and more particularly, to an improved circuit mounting structure, utilizing resin molding techniques, for use with an integrated circuit block such as those used in electronic watches.

In order to affix an integrated circuit chip to a circuit substrate, when used for example in the circuit block of a watch, various bonding techniques are used, such as: the wire bonding technique, in which an integrated circuit chip is connected directly to a circuit substrate through the use of wires; the gang bonding technique, in which the patterns on a circuit substrate are run over a hole and are utilized as the inner lead wire whereby an integrated circuit is bonded to the circuit substrate; and, the face down bonding technique, in which the circuit contact pad of an integrated circuit chip is directly connected to a circuit pattern provided on a circuit substrate. The invention is directed to improvements in the aforementioned face down bonding technique.

Generally in order to obtain a highly reliable physical and electrical coupling of an integrated circuit element to a circuit substrate, an epoxy resin coating is applied all around an integrated circuit chip through an injection molding process. In practice, the circuit substrate has a hole in that portion of it which is adjacent to the active surface of the integrated circuit chip. A fluid resin material is then introduced into and gated from the substrate hole into the space provided between the integrated circuit chip and the circuit substrate, thereby sealing the entire assembly. When the arrangement of the circuit patterns on the circuit substrate is such that no pattern is run underneath the active surface of the integrated circuit chip, the fluid resin material flows through the hole and completely surrounds the IC unit. A frame is generally mounted on the substrate around the chip to define a boundary for the resin material surrounding the chip. However, this requires an additional part and adversely affects miniaturization. A further problem with the prior art face down bonding technique results from the differences in the thermal coefficient of expansion of the materials. The gap between the chip and substrate must be made undesirably larger to allow for thermal effects, or the chip may be raised and disconnected.

In many instances, it is essential that integrated circuit chips be arranged in a densely packed manner. In these cases it is necessary for circuit patterns, which are formed on the circuit substrate, to be routed beneath the chip. When this occurs, the flow of the fluid resin material as it is gated from the hole is disturbed by the conductive patterns beneath the chip. Consequently, the entire space between the integrated circuit and the circuit substrate is not completely filled with resin material. It has been noted that this is most likely to happen when the space between the active surface of the integrated circuit chip and the conductive pattern on the circuit substrate is small.

Accordingly, it is desirable to provide a circuit mounting structure which eliminates the aforementioned difficulties and allows an integrated circuit chip to be mounted onto a circuit substrate in a close manner while continuing to allow a fluid resin moulding material to flow around, and completely seal the circuit structure.

SUMMARY OF THE INVENTION

Generally speaking, in accordance with the invention, an improved circuit mounting structure is provided. An integrated circuit is provided with conductive spacing pegs at each circuit contact pad of the IC chip and is affixed through a soldering step to a circuit substrate. The assembly is heated and as the solder melts the integrated circuit is pushed close to the circuit substrate. A uniform spacing is provided between the integrated circuit and the circuit substrate through the use of the spacing pegs. In addition, a secure electrical contact is assured.

A hole is provided in the circuit substrate at a position beneath the integrated circuit, so that a fluid resin molding material may be injected thereto, thereby sealing and structurely strengthening the integrated circuit assembly. In accordance with the invention, circuit patterns which are required to travel beneath the integrated circuit are routed across the opening in the circuit substrate, rather than around the opening, so that resin material will be allowed to flow freely and uniformly and completely surround the entire IC assembly.

In one preferred embodiment of the invention the spacing pegs are manufactured from a metal such as nickel or copper. The circuit substrate is preferably formed from a flexible material.

Accordingly, it is an object of this invention to provide an improved resin mounting structure for an integrated circuit, such as the integrated circuit block of a watch, in which a fluid resin material is completely spread over the surface of the integrated circuit chip even if a conductive circuit pattern is provided on the circuit substrate adjacent to and beneath the active surface of the integrated circuit chip.

Another object of the invention is to provide an improved resin mounting structure that does not increase resin costs.

A further object of the invention is to make an integrated circuit block which has a low profile, and is small in size.

Still other objects and advantages of the invention will in part be obvious and will in part be apparent from the specifications.

The invention accordingly comprises all of the features of construction, combination of elements and arrangements of parts which will be exemplified from the construction hereinafter set forth, and the scope of invention will be indicated in the claims.

BRIEF DESCRIPTION OF THE DRAWINGS

For a fuller understanding of the invention, reference is had to the following descriptions taken in connection with the accompanying drawings, in which:

FIG. 1a is a top plan view of the resin mounting structure for an integrated circuit block made in accordance with the invention;

FIG. 1b is a cross-sectional view taken along line 1b—1b of FIG. 1;

FIG. 2b is a cross-sectional view taken along line 2b—2b of FIG. 2a.

FIG. 3b is a cross sectional view taken along line 3b—3b of FIG. 3a;

FIG. 5 is a partial cross-sectional view of the circuit block of FIG. 4 taken along line 5—5.

FIG. 7 is a partial sectional view of the circuit block of FIG. 6 taken along line 7—7;

DETAILED DESCRIPTION OF THE PREFERRED EMBODIMENTS

Figure 2A:
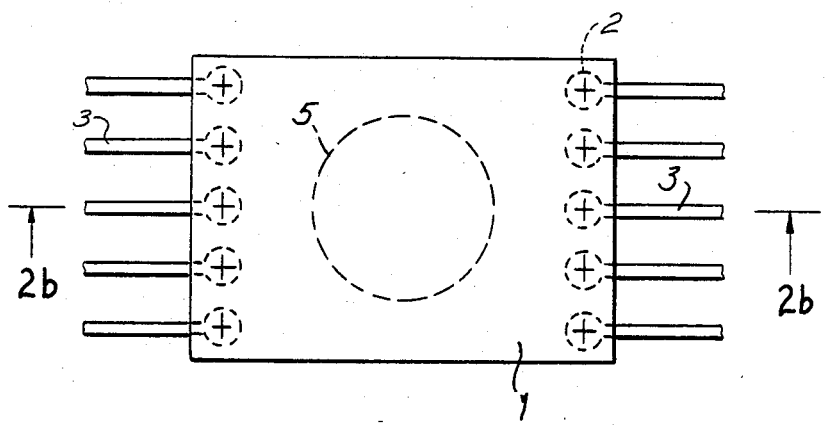
FIG. 2a is a top plan view of a conventional resin mounting structure for an integrated circuit block.
Figure 2B:
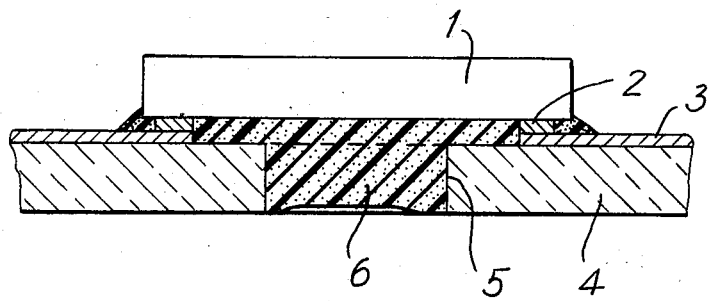

FIGS. 2a and 2b show the conventional method of mounting an integrated circuit chip on a circuit block using a resin. In the conventional method, a base film or substrate 4 is formed with a hole 5 positioned at a point adjacent to the active surface of the integrated circuit chip 1. Conductive projections or pads 2 project from the active surface of the chip 1 and are secured to conductive leads 3 formed in the desired pattern on base film 4. A fluid resin material 6 is gated from hole 5 to the space between the integrated circuit chip and the base film. This seals and maintains the integrated circuit chip to the base film.

When circuit patterns are arranged as shown in FIGS. 2a and 2b, the resin material flows freely under the entire area of the chip 1 and beyond, through the gaps between pads 2, since no conductive leads 3 are run or routed beneath the integrated circuit chip. Instead, all of the leads 3 are run from the periphery of the integrated circuit, outwardly from the chip contact pads 2, so that any resin material which is gated into the hole in the base film can move easily and freely to surround the integrated circuit chip.

Figure 3A:
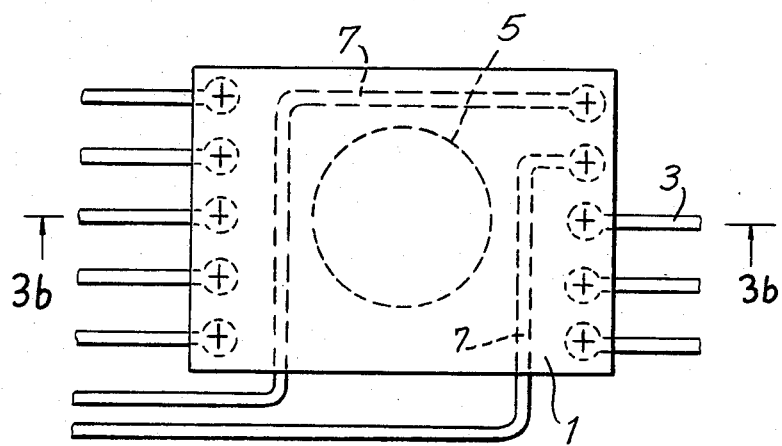
FIG. 3a is a top plan view of a conventional resin mounting structure for an integrated circuit where the conductive pattern on the substrate extends beneath the integrated circuit.
Figure 3B:
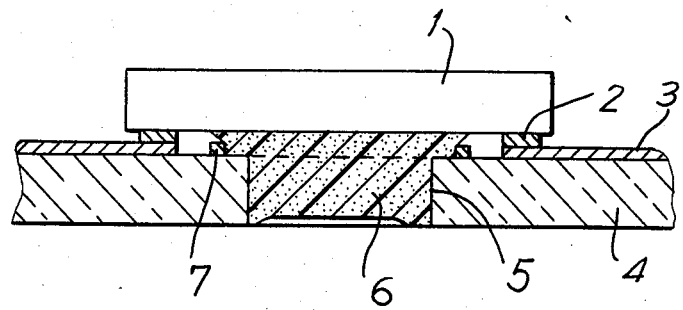

Referring now to FIGS. 3a and 3b, base film 4 is formed with hole 5 as shown in FIG. 2. However, as shown, a portion of the conductive circuit pattern, namely leads 7, extends along the surface of base film 4 on either side of hole 5, and beneath the active surface of integrated circuit chip 1. This arrangement of the conductive circuit pattern as exemplified by leads 7, as seen in FIG. 3a, is common and is especially important in those instances where a large number of integrated circuit chips are to be arranged in a very dense pattern, or in a circuit where one common integrated circuit chip is to be connected to many devices.

If the fluid resin material 6 is gated from hole 5, as shown in FIG. 3b, the flow of material is disturbed by the portion of the conductive circuit pattern beneath the chip, namely leads 7. Consequently, the entire space between integrated circuit chip 1 and base film 4 is not completely filled with resin material. It is noted that such an incomplete filling is most likely to occur when the space between the active surface of integrated circuit chip 1 and the conductive circuit pattern portion 7 is small, such as when the integrated circuit package has a low profile.

Referring to FIGS. 1a and 1b, wherein one embodiment of the invention is depicted, integrated circuit chip 1 is connected to base film or substrate 4' through the use of the face down bonding technique. Substrate 4' is preferably formed of a flexible material and hole 5 is of an area less than the area of the chip. A conductive circuit pattern including leads 3 and 8 are provided on the surface of circuit substrate 4' beneath integrated circuit chip 1. Conductive projections or pads 2 on the active surface of chip 1 are secured to said leads 3 and 8. In accordance with this invention, portions of the conductive pattern leads 8 are arranged so as to extend across or over hole 5', hole 5' being used for the introduction of the fluid resin material 6' into the integrated circuit structure. Using the above configuration, fluid resin material 6 is injected into hole 5' and flows across the surface of integrated circuit chip 1 without being disturbed by the portions of the conductive pattern beneath the chip, finally spreading over the entire active surface of the integrated circuit chip. Hole 5' is dimensioned so that the portions of the conductive pattern extending across hole 5' do not interfere with the injection of resin 6'.

In one embodiment, for example, the diameter of hole 5' may be 1.3 millimeters, the thickness and the width of conductive circuit pattern leads 8 may be 35 and 16 micrometers, respectively, and the distance between IC chip 1 and conductive circuit pattern leads 8 may be 15 micrometers.

The arrangement in accordance with the invention, namely the placement of portions of the conductive pattern beneath the chip so as to extend over the resin filling hole, may be produced in the course of the normal production of integrated circuit boards. There are other instances when portions of the conductive pattern will extend beyond the substrate and the conductive pattern portions extending over hole 5' may be made at the same time using conventional techniques. Accordingly, in a construction made according to the invention as described above, a difficulty in filling the integrated circuit chip structure with resin is eliminated at minimal cost.

Figure 4:
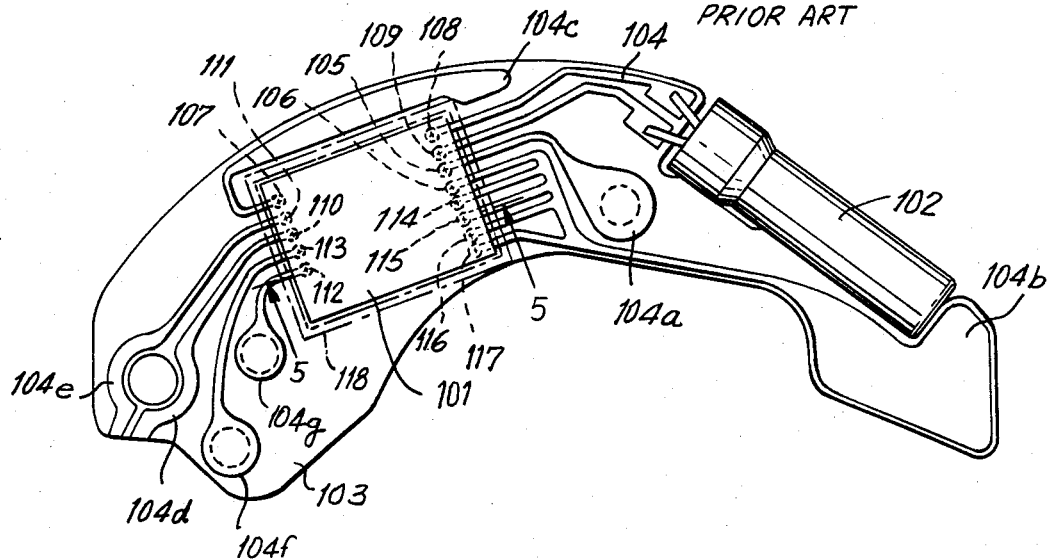
FIG. 4 is a plan view of one example of a conventional circuit block as used in a watch.

Referring now to FIG. 4 the conventional structure of the circuit block for an integrated circuit wrist watch is shown having MOS integrated circuit chip 101, quartz crystal vibrator unit 102 and conductive pattern 104. Specifically, positive pad 105 and negative pad 106 are in contact with leads supported on circuit substrate 103 extending to portions 104a and 104b of the circuit pattern, respectively, intended for coupling to a battery (not shown), to supply a source voltage the integrate circuit chip. Chip 101 is provided with a plurality of conductive projections or pads engaging various leads forming a part of circuit pattern 104. Reset pad 107 is in contact with a lead extending to circuit pattern portion 104c, provided for resetting the circuit of the integrated circuit chip when portion 104c is grounded. Gate pad 108 and drain pad 109 are in contact with leads coupled to the quartz crystal oscillator. $O_1$ pad 110 and $O_2$ pad 111 are electrically in contact with leads extending to portions 104d and 104e of the coil lead substrate (not shown), in order to output pulse signals to a watch coil. Logic regulation control pads 112 and 113 are in contact with leads extending to portions 104f and 104g of the circuit to allow external adjustment of the timing rate of the integrated circuit chip of the watch an error in which may be caused by variations in capacitance due to the variations in the oscillator itself, the inner circuit of the integrated circuit chip, or the copper foil of the circuit pattern.

Referring now to FIG. 5, a partial sectional view taken along line 5—5 of FIG. 4 is shown. The integrated circuit chip 101 is bonded to circuit patterns 104 on the circuit substrate 103 by the face down bonding technique. As can be seen, a resin molding material may be prevented from flowing into the space between the integrated circuit chip and the substrate, if applied only from above the chip. Accordingly, hole 103a is provided on substrate 103 at that portion of the substrate which is facing the active surface of integrated circuit chip as described above. Hole 103a is the hole through which molding material 119 is injected from the lower side of the substrate.

It is noted that in the process mentioned above, if substrate 103 is made of a rigid material, one or more of the integrated circuit contact pads may be torn from the integrated circuit chip under the influence of a differential thermal expansion. Therefore, the integrated circuit contact pad must have a sufficient height and be sufficiently distant from the circuit substrate pattern to compensate for differential thermal expansion. This results in an increase in the size of the circuit block. Referring to FIGS. 4 and 5, a frame 118 is generally provided to prevent the flow of molding material from out of the circuit structure. Frame 118 is provided on the substrate around that portion which is facing the periphery of the integrated circuit chip. Unfortunately, providing such a frame adds to the number of parts and also makes miniaturization of the integrated circuit device more difficult. Moreover, if the configuration of the watch, to which the integrated circuit chip is applied changes, the arrangement of the electronic elements will vary. However, the prior art arrangement limits the possible dispositions of the patterns. Thus, in some cases it is difficult to use the same type of integrated circuit chip in different watches.

Figure 6:
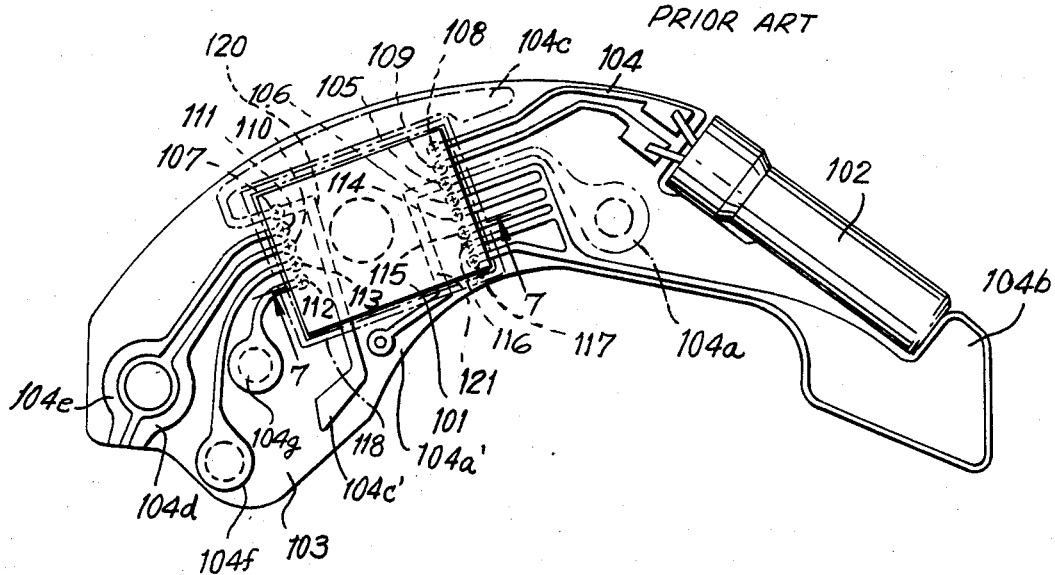
FIG. 6 is a top plan view of another example of a conventional circuit block as used in a watch.
Figure 8:
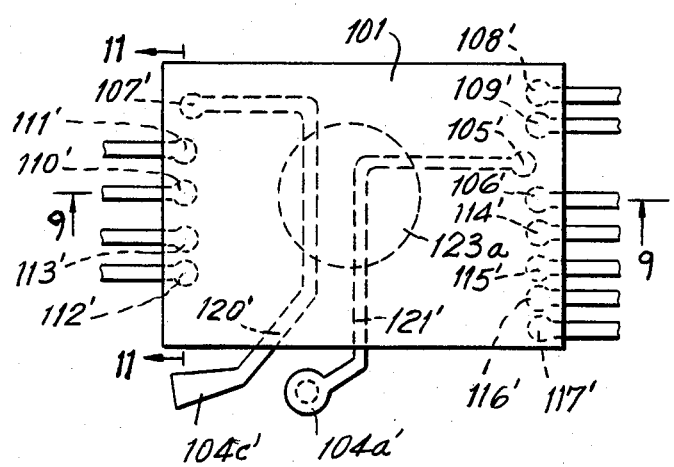
FIG. 8 is a top plan view of a further embodiment of the invention.
Figure 9:
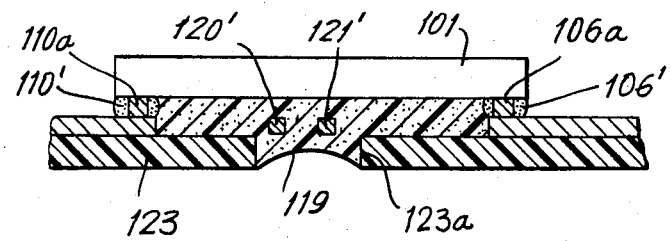
FIG. 9 is a cross-sectional view of the embodiment of Fig. 8 taken along line 9—9.

Referring now to FIG. 6, an alternative construction of a conventional circuit block is illustrated, like elements being assigned like reference numbers as used in FIG. 4 (shown in phantom in their original positions). In the circuit block of FIG. 6, conductive circuit pattern portions 104a and 104c are relocated on the opposite side of the substrate as circuit pattern portions 104a' and 104c'. In the embodiment of FIG. 4 the circuit pattern is provided around the integrated circuit chip. However, such a layout of the circuit pattern is impossible where the pattern portions 104a' and 104c' are relocated as shown in FIG. 6, due to a lack of surface space on the substrate. Therefore, in order to eliminate the above problem, leads 120 and 121 are provided on the substrate *under* the integrated circuit chip connecting pads 105 and 108 with portions 104a' and 104c', respectively, of the conductive circuit pattern.

Referring to FIG. 7 a partial sectional view of the circuit block of FIG. 6 taken along the line 7—7, is shown; like reference numerals being applied to like elements in FIG. 6, corresponding but changed elements being assigned primed reference numerals. It is seen once again that leads 120 and 121 provided under the integrated circuit chip 101 are likely to disturb the flow of the resin molding material 119. In the conventional structure, in order to avoid this problem, the space between the integrated circuit chip and the substrate is enlarged. This makes the circuit block thick and consequently thickens the wrist watch itself.

Reference is now had to FIGS. 8-11, in which a further embodiment of the arrangement in accordance with the invention is depicted. Specifically, leads 120' and 121' are relocated under the integrated circuit chip 101 so as to run across rather than around hole 123a, formed in circuit substrate 123. Hole 123a is used for injecting the resin molding material 119. In a preferred embodiment of the invention, circuit substrate 123 is formed of a flexible tape material.

Figure 10:
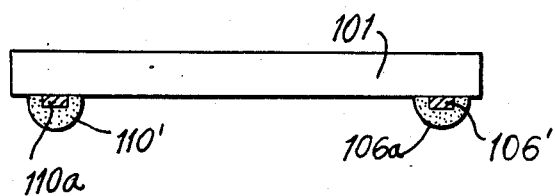
FIG. 10 is an enlarged view of the integrated circuit chip of FIG. 8 before mounting.

As more particularly shown in FIG. 10 the contact pads of integrated circuit chip 101 are each formed from a conductive, projecting spacing peg such as pegs 110a and 106'a formed of a metal such as nickel having a higher melting point than solder. Before mounting, the spacing pegs are surrounded by solder such as solder 110' and 106a, which extends around the sides and end of the pegs as shown in FIG. 10. While peg 110' and 106' are shown by way of example, all of pads 105-117 are formed of the same construction.

The manufacturing process of the circuit block in accordance with the invention is now described in detail. The substrate comprises flexible tape 123 which is formed with hole 123a used for injecting molding material into the space between chip 101 and the circuit substrate. One side of flexible tape 123 is entirely coated with a metal foil such as copper. An etching process is used to remove the unnecessary copper foil and to form the desired circuit patterns. All circuit patterns which are to be provided on the flexible circuit substrate tape 123, and which will run beneath the integrated circuit chip 101, such as portions of leads 120' and 121'', are then formed across hole 123a, which is used for injecting molding material. Next, the integrated circuit chip is secured to the circuit substrate formed by the above process, by the face down bonding technique, with each circuit contact pad aligned with the corresponding lead in the circuit pattern on the circuit substrate. The assembly is heated and when the solder of each pad melts, the integrated circuit chip is pressed into the circuit substrate until the nickel spacing pegs 110a, 106a, etc., of each circuit contact pad reach and engage the surface of the associated leads of the circuit pattern. In this way the space between the integrated circuit chip and the circuit tape substrate is uniformed and minimized.

Figure 11:
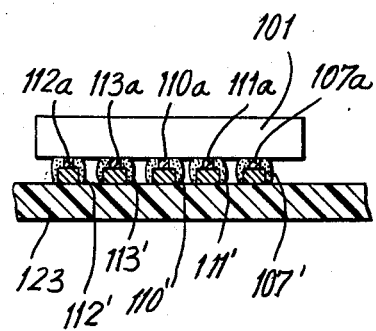
FIG. 11 is a cross-sectional view of the embodiment of Fig. 8 taken along line 11—11.

At this time, as is shown in FIG. 11, the melted solder of each pad surrounds the nickel peg and the adhesion between the integrated circuit chip and the circuit substrate is reinforced. Finally, resin molding material is gated through the injecting hole to fill the space between the integrated circuit chip and the circuit substrate.

According to the above embodiment of the invention, the circuit substrate is formed on a flexible tape, so that the tendency of the integrated circuit to separate from the circuit substrate under the influence of a differential thermal expansion is prevented even if the space between the IC chip and the circuit substrate is small.

Moreover, in accordance with this invention, all of the patterns which are provided on the circuit substrate, and which run beneath the integrated circuit chip, are arranged so that they cross over the resin molding material injecting hole located in the circuit substrate. Consequently, there is no occurrence wherein the patterns disturb the injecting molding material so that the space between the integrated circuit and the circuit substrate is not completely filled.

Furthermore, the integrated circuit chip is spaced away from the circuit substrate in a simple manner by providing a spacing peg at each circuit contact pad.

Further still, since the space between the integrated circuit chip and the circuit substrate is small, the molding material does not flow out from the gaps between the pads towards the periphery of the integrated circuit chip, but rather is kept between the chip and the circuit substrate through the use of surface tension. In this way, the frame, which was necessary to prevent the resin molding material from flowing away, is not required and the circuit substrate as a whole can be made much smaller and thinner. Through experiment it is found that when the space between the integrated circuit chip and the circuit substrate is on the order of 10 micrometers to 20 micrometers, the flow of the molding material out from the integrated circuit is the lowest.

As noted above, the use of a spacing peg of nickel in each integrated circuit contact pad is described. It is easily understood, however, that a peg made of another metal, such as copper or gold, is equally applicable, provided the melting point of the peg is more than the melting point of the solder.

Thus, as described, the present invention relates to a circuit in which the patterns of a circuit substrate provided under an integrated circuit chip are all formed so as to run over a hole used for injecting molding material. In addition, the integrated circuit is kept apart from the circuit substrate by providing a metal spacer peg at each integrated circuit contact pad. In this way, the arrangement of all the circuit patterns are variable, and the same integrated circuit chip can be used in circuit blocks having different arrangements of electronic elements for watches of various functions. This provides an advantage in the mass production of integrated circuit chips. Additionally, since the patterns provided under the integrated circuit cross over the hole for injecting the molding material, the space between the integrated circuit chip and the circuit substrate can be made to be small. Also, since the circuit substrate is made of a flexible tape, separation of the contact pads from the integrated circuit chip under the influence of a differential thermal expansion is not likely to occur even if the space between the integrated circuit chip and circuit substrate is small. Moreover, the provision of the solder originally surrounding the spacer pegs aids in maintaining the integrated circuit chip on the circuit substrate.

Using a construction defined according to the above invention, the structure is kept simple and the fixation between the integrated circuit chip and circuit substrate is secure. Finally, as the space between the integrated circuit chip and circuit substrate is small, the molding material does not flow out to the periphery of the integrated circuit chip. Consequently, a frame for preventing the flowing out of the molding material is not necessary and the circuit block is allowed to be made smaller and thinner.

It will thus be seen that the objects set forth above, and those made apparent from the preceding description, are attained, and since certain changes may be made in the above constructions without departing from the spirit and scope of the invention, it is intended that all matter contained in the above description or shown in the accompanying drawings shall be interpreted in an illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A mounting structure and an integrated circuit chip mounted thereon having conductive contact pads located in peripheral regions of said chip comprising a circuit substrate formed with a hole therethrough in registration with the integrated circuit chip and having an area less than the facing area of the chip; circuit pattern means carried on said substrate and positioned for operative engagement by said chip contact pads, the portions of said circuit pattern means extending in the region of the substrate beneath the chip and intermediate the pads being routed to extend across said hole; and resin material injected through said hole into the space between said chip and substrate, whereby the resin essentially occupies at least the portion of said space intermediate said pads and including the area of the hole, the height of the space between said chip and said substrate being selected so that said resin does not flow out beyond the adjacent periphery of said chip through the use of surface tension.

2. A mounting structure and an integrated circuit chip mounted thereon as claimed in claim 1, wherein said substrate is formed of a flexible material.

3. A mounting structure and an integrated circuit chip mounted thereon as claimed in claim 1, wherein at least a plurality of said conductive contact pads of said integrated circuit chip each includes a metal spacer peg in conductive engagement with said circuit pattern means and solder surrounding said peg and coupling said chip to said substrate, said pegs defining the height of the space between said chip and said substrate.

4. A mounting structure and an integrated circuit chip mounted thereon as claimed in claim 3, wherein said pegs are formed from a metal selected from the group consisting of nickel, gold or copper.

5. A mounting structure for an integrated circuit chip as claimed in claim 3, wherein said substrate is formed of a flexible material.

6. A mounting structure and an integrated circuit chip mounted thereon as claimed in claim 3, wherein all of said chip pads include said pegs and solder.

7. In a timepiece, a mounting structure for an integrated circuit chip having conductive contact pads located in peripheral regions of said chip comprising a circuit substrate formed with a hole therethrough in registration with the integrated circuit chip and having an area less than the facing area of the chip; circuit pattern means carried on said substrate and positioned for operative engagement by said chip contact pads, the portions of said circuit pattern means extending in the region of the substrate beneath the chip and the intermediate the pads being routed to extend across said hole; resin material injected through said hole into the space between said chip and substrate, whereby the resin essentially occupies at least the portion of said space intermediate said pads and including the area of the hole; said substrate formed of a flexible material; at least a plurality of said conductive contact pads of said integrated circuit chip each including a metal spacer peg in conductive engagement with said circuit pattern means and solder surrounding said peg and coupling said chip to said substrate, said pegs defining the height of the space between said chip and substrate, whereby the resin injected through said hole spreads over said space between said circuit substrate and said chip by the effect of the surface tension and stops flowing in the peripheral regions of said chip.

8. The mounting structure of claim 7, wherein the distance between the circuit pattern means carried on said substrate and said integrated circuit chip is between about 10 and 20u.

9. The mounting structure of claim 7, wherein said resin material is an epoxy resin.

10. The mounting structure of claim 7, wherein the circuit pattern means is a circuit pattern that is fixed on the surface of the substrate.

11. A mounting structure and an integrated circuit chip mounted thereon so as to have a space therebetween, said circuit chip having conductive contact pads located in peripheral regions of said chip on the side adjacent the mounting structure, at least a plurality of said conductive pads including metal spacer pegs which define the height of the space between the chip and the mounting structure, said mounting structure comprising a circuit substrate formed of a flexible material and having a hole therethrough, said hole having an area less than the facing area of the chip and being in registration with the integrated circuit chip; circuit pattern means carried on said substrate on the side adjacent the chip and conductively coupled with said chip contact pads by said metal spacer pegs, portions of said circuit pattern means extending intermediate the pads being routed to extend across said hole; resin material injected through said hole into the space between said chip and substrate, wherein the resin material essentially occupies at least a portion of said space intermediate said pads and including the area of the hole and spreads into the space between said chip and substrate by the effect of surface tension and stops flowing in peripheral regions of said chip.

* * * * *